United States Patent [19]
Brown et al.

[11] Patent Number: 5,378,642
[45] Date of Patent: Jan. 3, 1995

[54] METHOD OF MAKING A SILICON CARBIDE JUNCTION FIELD EFFECT TRANSISTOR DEVICE FOR HIGH TEMPERATURE APPLICATIONS

[75] Inventors: Dale M. Brown, Schenectady; Mario Ghezzo, Ballston Lake, both of N.Y.

[73] Assignee: General Electric Company, Schenectady, N.Y.

[21] Appl. No.: 48,448

[22] Filed: Apr. 19, 1993

[51] Int. Cl.⁶ .......................................... H01L 21/266
[52] U.S. Cl. ..................................... 437/40; 437/100; 437/911
[58] Field of Search .......... 437/40, 100, 915, 973–986, 437/911; 148/DIG. 148, DIG. 154

[56] References Cited

U.S. PATENT DOCUMENTS

| | | | |
|---|---|---|---|
| 4,757,028 | 7/1988 | Kondoh et al. | 437/40 |
| 4,762,806 | 8/1988 | Suzuki et al. | 437/100 |
| 4,897,710 | 1/1990 | Suzuki et al. | 257/77 |
| 5,170,231 | 12/1992 | Fujii et al. | 437/100 |
| 5,264,713 | 11/1993 | Palmour | 437/100 |

OTHER PUBLICATIONS

Ghandhi, S. K., "VLSI Fabrication Principles, Silicon and Gallium Arsenide", pp. 420–424, 1983.
"Nitrogen-Implanted SiC Diodes Using High-Temperature Implantation" by Mario Ghezzo, et al, IEEE Electron Device letters, vol. 13, No. 12, Dec. 1992.
"Epitaxial Deposition of Silicon Carbide from Silicon Tetrachloride and Hexane" by W. V. Muench, et al, Thin Solid Films, 31 (1976), pp. 39–51.

Primary Examiner—Brian E. Hearn
Assistant Examiner—Chandra Chaudhari
Attorney, Agent, or Firm—Ann M. Kratz; Marvin Snyder

[57] ABSTRACT

A silicon carbide (SiC) junction field effect transistor (JFET) device is fabricated upon a substrate layer, such as a p type conductivity SiC substrate, using ion implantation for the source and drain areas. A SiC p type conductivity layer is epitaxially grown on the substrate. A SiC n type conductivity layer is formed by ion implantation or epitaxial deposition upon the p type layer. The contacting surfaces of the p and n type layers form a junction. A p+ type gate area supported by the n type layer is formed either by the process of ion implantation or the process of depositing and patterning a second p type layer. The source and drain areas are heavily doped to n+ type conductivity by implanting donor ions in the n type layer.

9 Claims, 7 Drawing Sheets

METHOD OF MAKING A SILICON CARBIDE JUNCTION FIELD EFFECT TRANSISTOR DEVICE FOR HIGH TEMPERATURE APPLICATIONS

This invention was made with Government support under Government Contract No. F33615-90-C-1494 awarded by the Air Force. The Government has certain rights in this invention.

BACKGROUND OF THE INVENTION

1. Field of the Invention

This invention relates to semiconductor devices, and more particularly to silicon carbide junction field effect transistors (JFETs) having low gate leakage for high temperature applications.

2. Description of the Related Art

Silicon carbide (SIC) is a crystalline substance that can withstand very high temperatures. Semiconductor devices manufactured of SiC can withstand temperatures in excess of 200° C. Thus, SiC semiconductors are desirable for applications that require exposure to high temperatures.

SiC electronics technology can be viewed as a means of controlling flame temperature by reducing fuel-to-air ratios in high temperature environments, such as encountered in the combustion of a stationary gas turbine or gas turbine employed in an aircraft jet engine, which reduces the production of nitrogen oxide ($NO_x$) emissions. When the operating temperature is excessively high, $NO_x$ emissions, which are classified as pollutants, are also excessively high. However, when fuel is burned lean to hold down the flame temperature, the flame can produce too much CO and become unstable or even be extinguished. The design constraints for these turbine combustors have become so exacting that the manufacturing tolerances are difficult to achieve. An apparatus for addressing these problems by using a closed loop control of the flame temperature is disclosed in commonly assigned D. M. Brown et al., "Combustion Control for Producing Low $NO_x$ Emissions Through Use of Flame Spectroscopy," U.S. application Ser. No. 07/878,933, filed May 5, 1992, which is herein incorporated by reference.

High temperature sensors can be used for monitoring and controlling the chemical content of the turbine exhaust gases, but electronic amplifiers for amplifying the sensor signals must be situated at some distance from the combustion zone and exhaust to avoid performance degradation or destruction on account of the high temperatures near the combustion zone. Detrimentally, the signal level from the sensor is degraded by noise components in the connective wiring as the signal propagates from the sensor to a remote amplifier. As a result, the signal-to-noise ratio (SNR) is reduced. Preferably, a sensor and an amplifier are combined so that little degradation of the signal occurs as the signal passes from the sensor to the amplifier. Advantageously, a properly designed SiC semiconductor amplifier is capable of withstanding the high temperatures near a turbine exhaust outlet. Therefore, use of a combined SiC based semiconductor amplifier and sensor will result in improved turbine flame monitoring and control apparatus.

A SiC sensor is disclosed in commonly assigned D. M. Brown et al., "Silicon Carbide Photodiode with Improved Short Wavelength Response and Very Low Leakage Current," U.S. application Ser. No. 07/878,937, filed May 5, 1992, which is herein incorporated by reference. A SiC metal-oxide-semiconductor field effect transistor (MOSFET) is disclosed in commonly assigned D. M. Brown et al., "Silicon Carbide MOSFET Having Self-Aligned Gate Structure and Method of Fabrication," application Ser. No. 07/925,823, filed Aug. 7, 1992, which is herein incorporated by reference. MOSFETs generally exhibit a high gain-bandwidth product and high input impedance, which are desirable for amplifying low level voltages. However, operating voltages required for reliable MOSFET device operation at very high temperatures must be kept very low because of the time dependent breakdown of the insulating layer, and therefore the voltages for reliable operation in the desired temperature range are not high enough for all of the applications desired.

SUMMARY OF THE INVENTION

Accordingly, an object of the present invention is to provide a SiC device for high temperature applications.

Another object is to provide a SiC device for controlling gas turbine flame temperature at reduced fuel-to-air ratios which reduces the production of $NO_x$.

Briefly, according to a preferred embodiment of the invention, a method for fabricating a SiC JFET device comprises providing, upon a first SiC layer of a first conductivity type, a second SiC layer of a second conductivity type. The contacting surfaces of the first and second layers form a junction. A gate area of the first conductivity type is provided and supported by the second layer. Ions of the second conductivity type are implanted in the second layer in a source area and a drain area.

BRIEF DESCRIPTION OF THE DRAWINGS

The features of the invention believed to be novel are set forth with particularity in the appended claims. The invention itself, however, both as to organization and method of operation, together with further objects and advantages thereof, may best be understood by reference to the following description taken in conjunction with the accompanying drawings, where like numerals represent like components, in which:

DETAILED DESCRIPTION OF A PREFERRED EMBODIMENT OF THE INVENTION

Although the invention is applicable to both n-channel and p-channel JFET devices and their manufacture, for purposes of simplicity the following description will consider fabrication only of a JFET having an n-channel. A p-channel device can be fabricated by reversing each conductivity type discussed with respect to an n-channel device.

Figure 1:
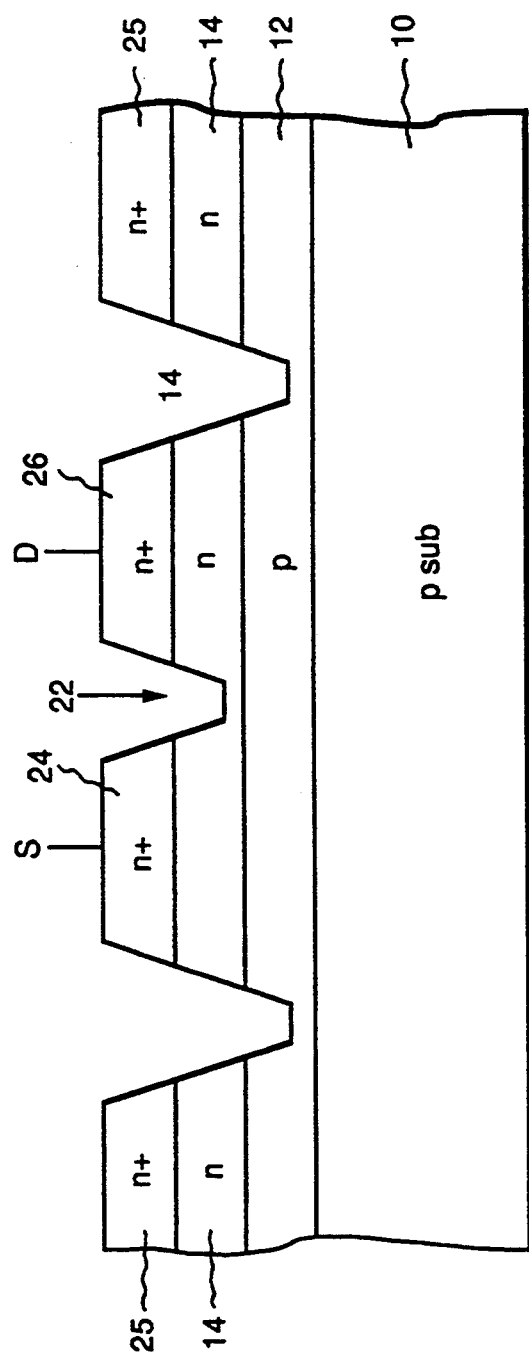
FIG. 1 is a sectional side view of a conventional SiC JFET device wherein the gate is the substrate.

FIG. 1 is a sectional side view of a conventional SiC JFET device including several layers 12 and 14 wherein the gate G is the substrate 10. However, this configuration does not lend itself to device integration since the gate constitutes the outermost layer (i.e., substrate) on the backside of the device, i.e., the side opposite the side where source S and drain D areas 24 and 26 of n+ type layer 25 are situated. Moreover, the gate area greatly exceeds the active channel area, thus causing the device to be more susceptible to defects and have increased gate leakage and gate capacitance compared to a comparable device in which the gate area and active channel area are approximately equal. Additionally, threshold variation is magnified because an exactly accurate channel groove 22 depth is difficult to achieve.

Figure 2:
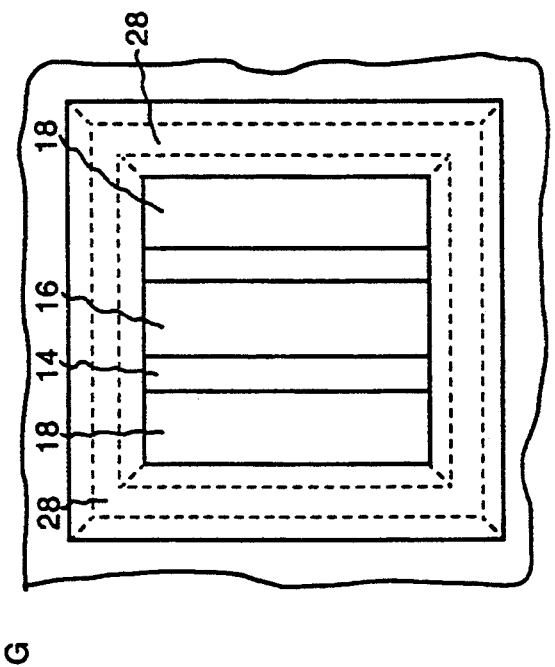
FIG. 2 is a top view of a linear SiC JFET device of the present invention including a gate on the surface opposite a substrate and ion implanted source and drain areas located on opposite sides of the gate.

FIG. 2 is a top view of a linear SiC JFET device of the present invention including a SiC gate 16 of one conductivity type which is supported by a SiC layer 14 having opposite conductivity, and ion implanted source and drain areas 18 located in layer 14 on opposite sides of the gate. The phrase "supported by" is meant to encompass both the situation wherein an additional layer rests on layer 14 and the situation wherein a surface-adjacent portion of layer 14 has opposite conductivity from the bulk of layer 14. Layer 14, which is supported by a SiC layer 12 (shown in FIG. 3 and FIGS. 5-6) having the one type conductivity, is formed by either epitaxial deposition or ion implantation. An isolation groove or trench 28 surrounds the linear SiC JFET to isolate the JFET from other devices in an integrated circuit.

Figure 3:
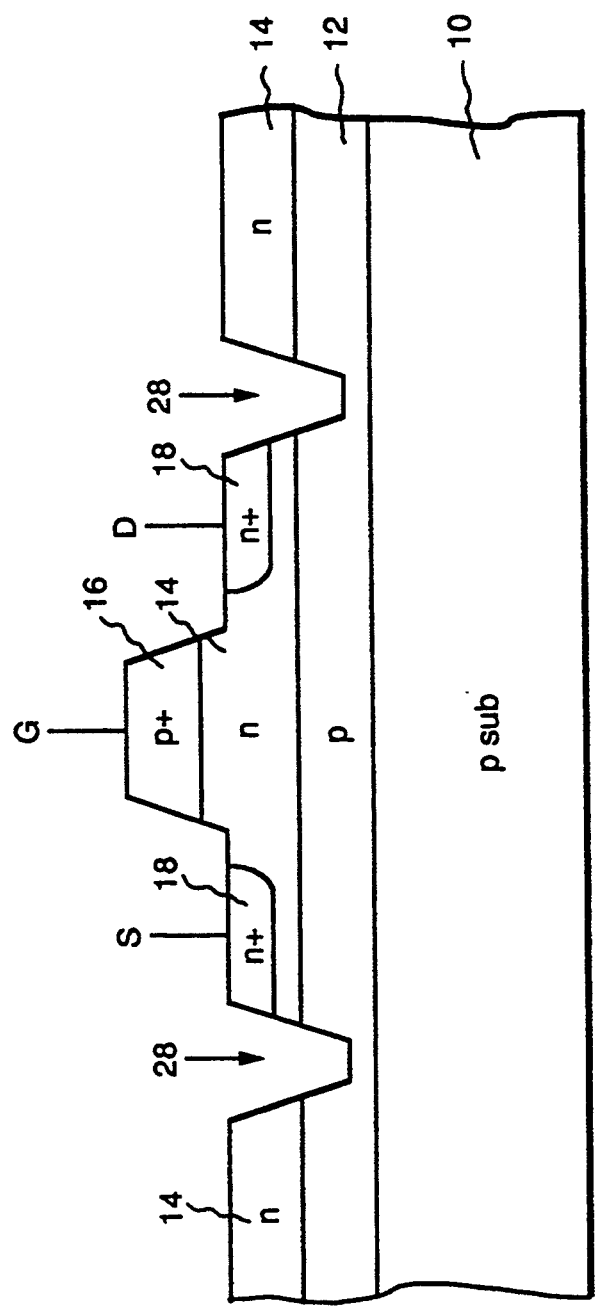
FIG. 3 is a sectional side view of one embodiment of the device shown in FIG. 2, wherein the gate is a separate semiconductor layer.
Figure 7:
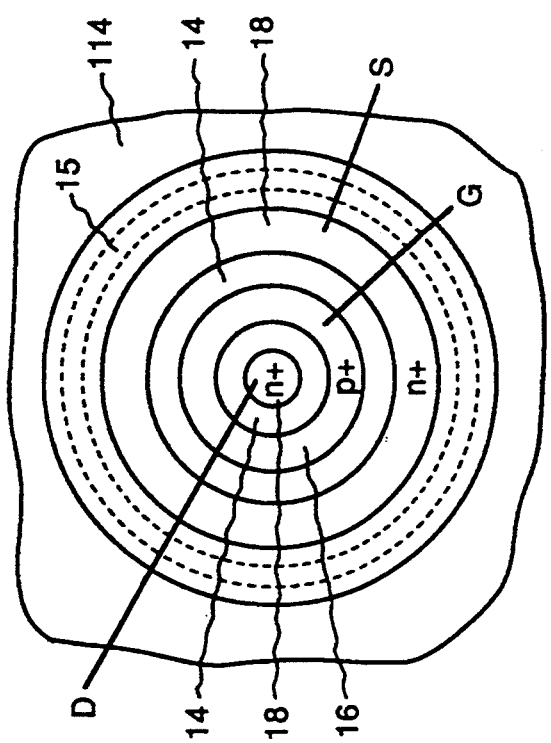
FIG. 7 is a top view of an annular SiC JFET device including a gate on the surface opposite a substrate in the shape of an annulus and ion implanted source and drain areas located inside and outside the annulus, respectively.
Figure 8:
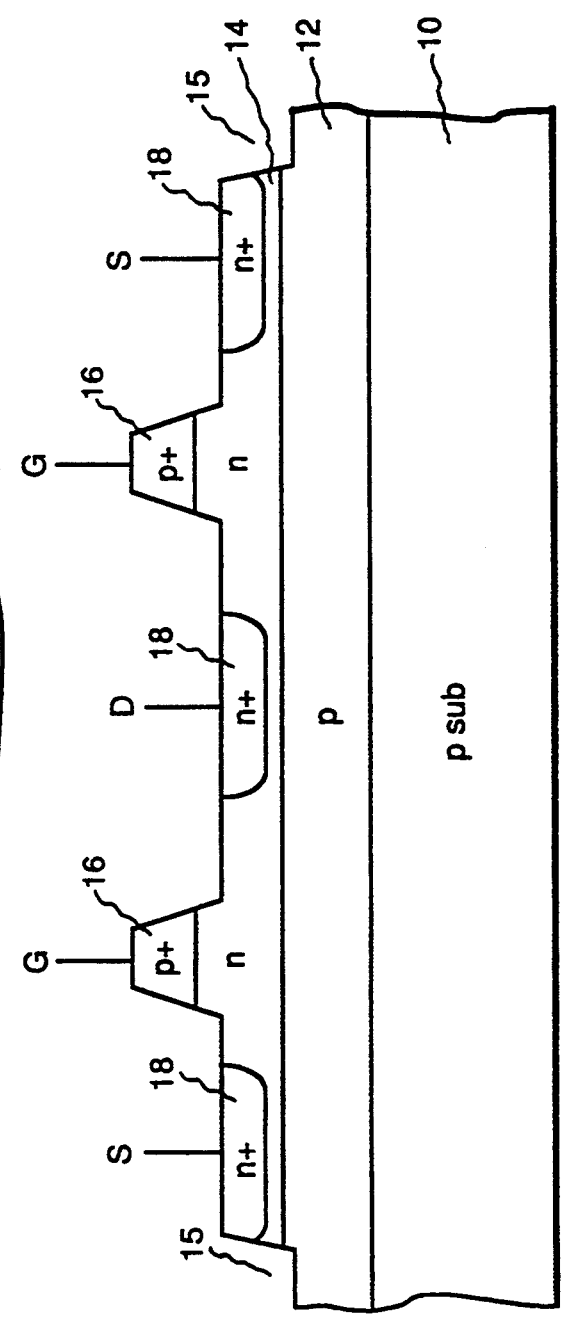
FIG. 8 is a sectional side view of one embodiment of the device shown in FIG. 7, wherein the gate is a separate semiconductor layer.
Figure 9:
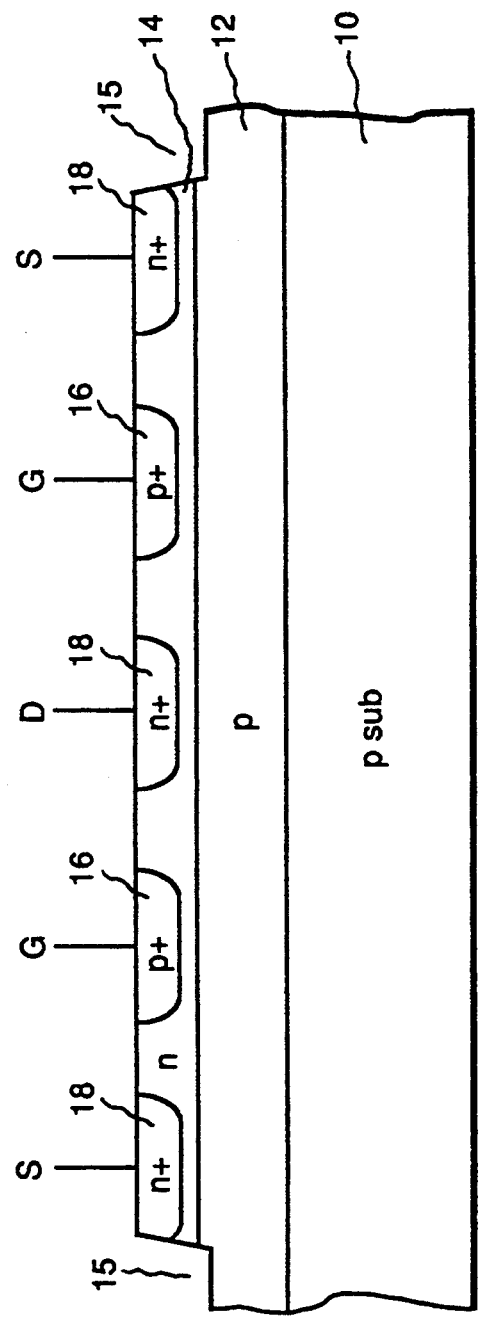
FIG. 9 is a sectional side view of another embodiment of the device shown in FIG. 7, wherein the gate is an ion implanted gate.

FIG. 3 is a sectional side view of one embodiment of the linear SiC JFET device shown in FIG. 2. SiC substrate 10 is of p type conductivity and has a depth, for example, of 0.5 millimeters. Although substrate 10 can support individual transistors of various types, for simplicity the description will focus upon creation of transistors having linear structures (FIGS. 2-6) and transistors having annular structures (FIGS. 7-9).

In one embodiment, a p (or p+) type conductivity layer 12 of SiC is epitaxially and uniformly deposited on substrate 10 by a method such as chemical vapor deposition (CVD). A typical dopant for p type layer 12 comprises aluminum, for example, at a concentration of $10^{18}$ atoms/cm$^3$, and, in one embodiment, p type layer 12 is one micrometer thick. The reason for adding p type layer 12 on the substrate, which already is of p type conductivity, is that the dopant concentration in a SiC substrate is generally not certain or uniform. The doping level, and thus the conductivity of p type layer 12, can be controlled when adding p type layer 12.

An n type layer 14 is then formed by epitaxially growing a uniformly thick SiC layer over the entire p type layer 12. Layer 14 is preferably grown to a total thickness of less than 1 micrometer and has a nitrogen doping level of about $10^{16}$–$10^{17}$ atoms/cm$^3$. The contacting surfaces of p type layer 12 and n type layer 14 form a diode junction.

In the embodiment depicted in FIG. 3, the gate is then fabricated by first epitaxially depositing a uniform p+ type layer 16 and then removing p+ type layer 16 everywhere except for the gate area. Layer 16, which is doped to a concentration of $10^{18}$ atoms/cm$^3$ of an appropriate dopant such as aluminum and need only be about 3000 Å thick, can be etched by using a hard mask (not shown) formed by applying a layer of metal such as aluminum and then using a photoresist to pattern desired openings in the mask surface. The metal can be deposited by sputtering, for example, and, in one embodiment, is 0.5 micrometers thick. A photoresist such as AZ1470, manufactured by Hoechst, can next be applied and then selectively exposed and removed to pattern the metal layer. The metal can be etched by reactive ion etching (RIE) using, for example, borontrichloride and oxygen ($BCl_3/O_2$).

A chemical etch or a RYE process is used to remove the portion of p+ type layer 16 which is not located under the hard mask. The etch is preferably designed to end at the point in time when all the unmasked portion of p+ type layer 16 has been removed but before the underlying n type layer 14 is significantly etched. The preferred embodiment for etching SiC includes a reactive ion etch using $NF_3/O_2$ (flow rate for $NF_3$ of 16 sccm, of $O_2$ 4 sccm; pressure of 40 millitorr; power of 300 W) which etches at a rate of 635 Å/minute. For a solution etch, molten alkalis or borax can be used, as described in W. V. Muench and I. Pfaffeneder, *Thin Solid Films*, 31, 39 (1976). After completing the SiC etch, the metal mask is removed by a wet etch in phosphoric/nitric/acetic acid.

The n+ type drain and source areas 18 are formed by ion implantation of additional ionized donor atoms into n type layer 14 on opposite sides of the gate. The dopant can comprise nitrogen atoms, for example, which are donors in SiC material, at a concentration of $10^{20}$ atoms/cm$^3$. A mask (not shown) can be fabricated so that ions will be implanted only through the mask openings into the desired areas. For example, mask material can comprise a layer of $SiO_2$ 6000–10,000 Å thick, deposited by CVD using silane ($SiH_4$) and oxygen. A photoresist can be used to pattern the $SiO_2$ layer, which can be etched using the same $NF_3/O_2$ process discussed with respect to SiC, resulting in an etch rate of 548 Å/minute.

Figure 4:
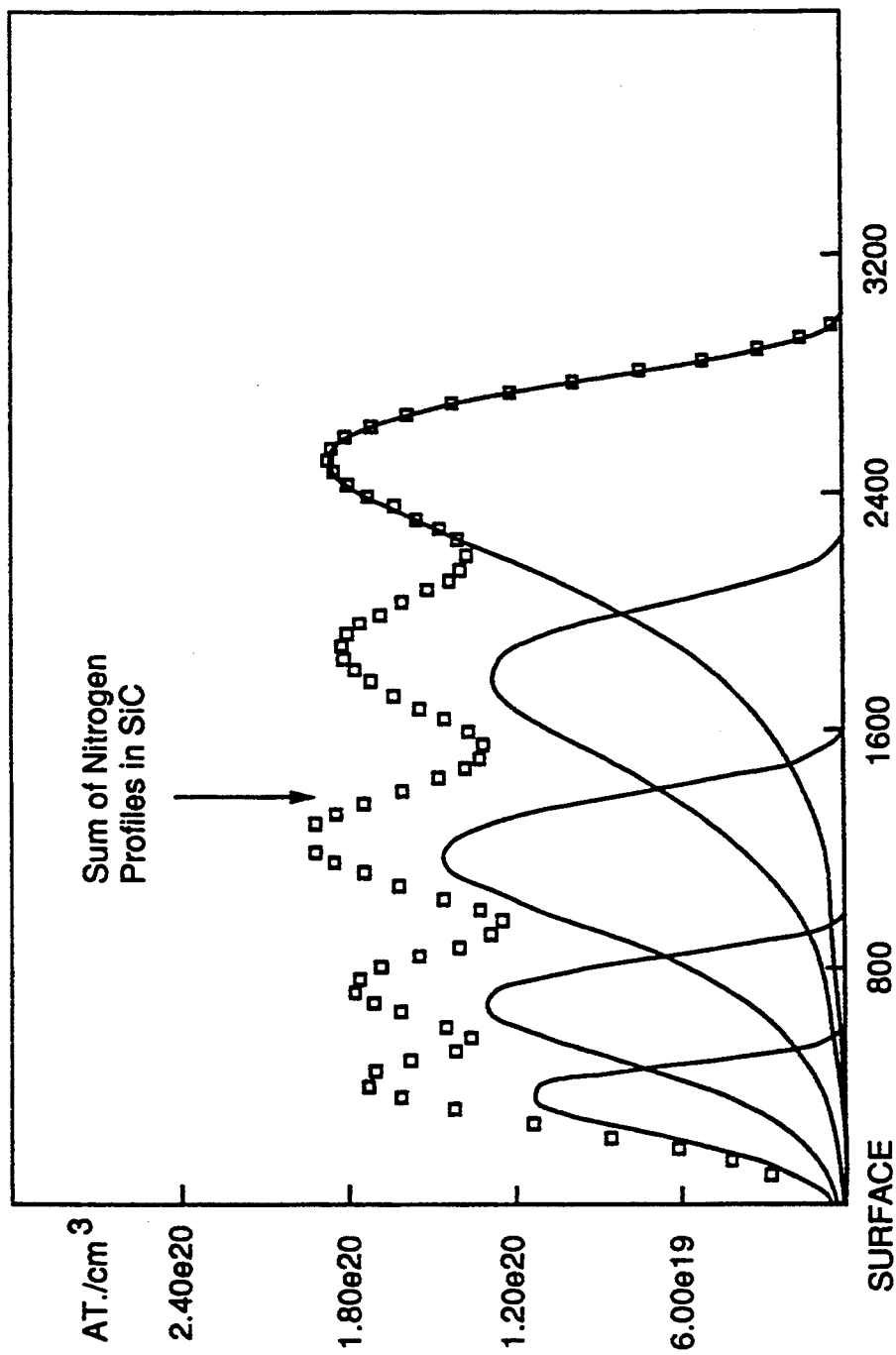
FIG. 4 is a graph illustrating the simulation of nitrogen-implanted profiles in SiC.

The energy used for supplying the dopant through the $SiO_2$ mask openings must be varied so that the dopant is uniformly dispersed throughout the desired volume. For example, the substrate can be held at 1000° C. during ion implantation on the furnace end station of an ion implantation apparatus, such as supplied by Implant Science Corp. of Wakefield, Mass., and subjected to a multiple implant sequence of various doses and energies to create a junction 3000 Å deep with an average concentration of $1.6 \times 10^{20}$ atoms/cm$^3$. A multiple implant sequence having various doses and energies is needed to create a box profile because, unlike Si, it is difficult to use heating to cause ions to diffuse to a desired depth in SiC. Thus, ions must be implanted at each depth of the desired drain and source. Implant Science Corp. markets a computer program, known as "Profile," for SiC implantation which can model the proper doses and energies for the desired application. FIG. 4 is a graph illustrating the simulation of nitrogen-implanted profiles in SiC for the following implants: 180 KeV, $1.6\times10^{15}$ ions/cm$^2$; 120 KeV, $9.7\times10^{14}$ ions/cm$^2$; 75 KeV, $8.8\times10^{14}$ ions/cm$^2$; 40 KeV, $5.7\times10^{14}$ ions/cm$^2$; 20 KeV, $3.2\times10^{14}$ ions/cm$^2$.

After implantation, the substrate is held at 1300° C. in a resistively heated ceramic sintering furnace. Further options for the implantation process, including the use of n and p type 6H-SiC layers in the preferred embodiment, are discussed in M. Ghezzo et al., "Nitrogen-Implanted SiC Diodes Using High Temperature Implantation," IEEE Electron Device Letters Dec. 13, 1992, pp. 639-641. Afar the source and drain have been formed, the SiO$_2$ mask is removed by a wet etch in buffered hydrofluoric add. In another embodiment, 3C-SiC semiconductor layers are used.

Trench 28, which is useful for defining the boundaries of a JFET device, can be formed through a mask in a similar manner as the etching of p+ type layer 16. The RIE etchant is a gaseous mixture of 16 parts NF$_3$ and 4 parts O$_2$ by volume which etches a 1 micrometer deep groove in SiC in about 15 minutes.

The steps of forming the gate, implanting ions in n type layer 14, and fabricating trench 28 are preferably performed in that order, although the trench can be formed earlier, if desired.

Figure 5:
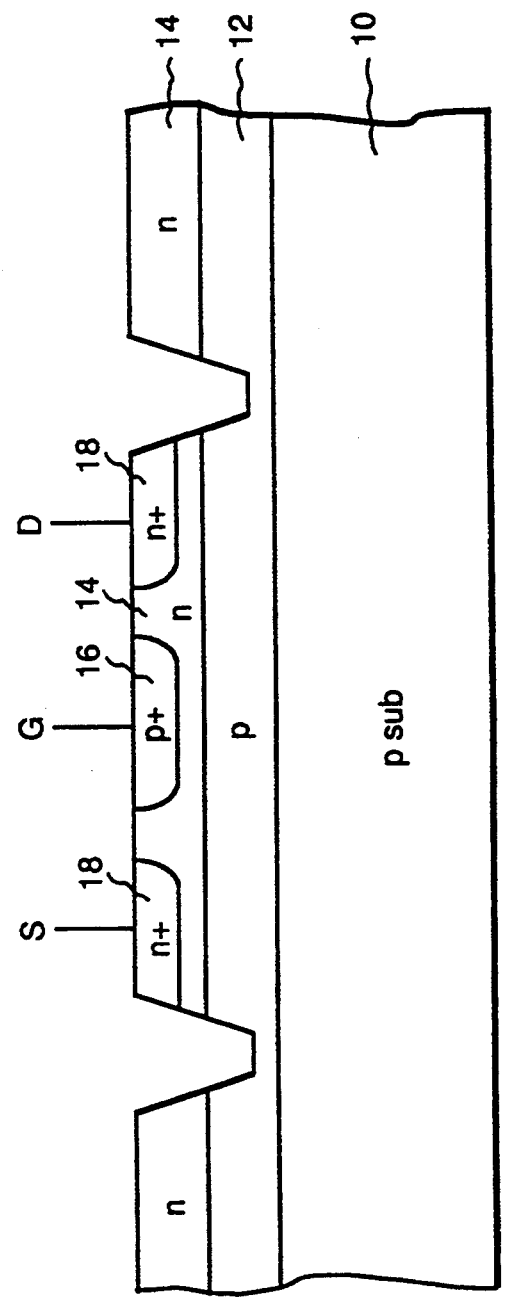
FIG. 5 is a sectional side view of another embodiment of the device shown in FIG. 2, wherein the gate is an ion implanted gate.

FIG. 5 is a sectional side view of another embodiment of the device shown in FIG. 2, wherein gate 16 is fabricated using ion implantation. The process of fabricating a gate by ion implantation is a separate implantation step which is similar to the implantation steps performed in fabricating the source and drain areas, except that an acceptor dopant for SiC such as boron is used, instead of a donor dopant such as nitrogen. The p+ type gate region preferably has a concentration of acceptor dopants in excess of the n doped channel region. Typically, the p+ type gate layer dopant concentration is between $10^{18}$–$10^{19}$ atoms/cm$^3$.

In another embodiment also represented by FIG. 5, both n type layer 14 and gate 16 are fabricated using ion implantation. Implantation of n type ionized donor atoms into p type layer 12 can be used to create n type layer 14 in the same manner as described with reference to the fabrication of the gate and drain areas in FIG. 3, with modifications for increased depth and a lower concentration of donor atoms. Source and drain areas 18 are fabricated as discussed with respect to FIG. 3, and gate area 16 is fabricated as discussed above.

Figure 6:
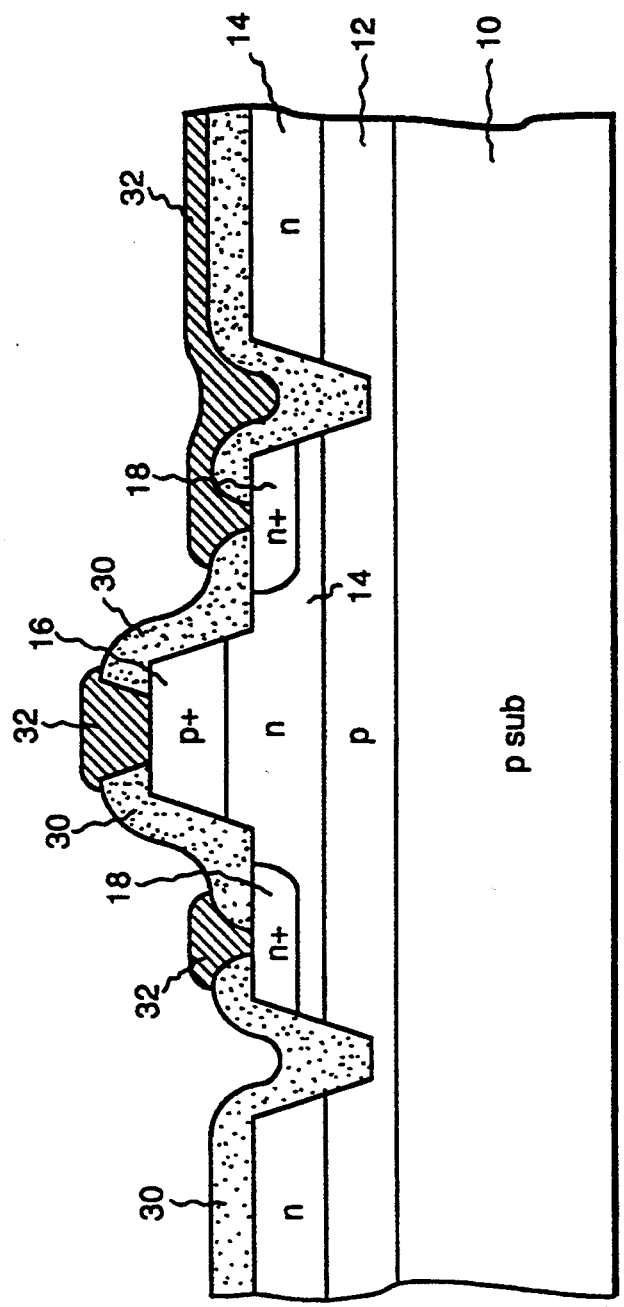
FIG. 6 is a sectional side view of the device shown in FIG. 3, further including an oxide layer and metal interconnects.

FIG. 6 is a sectional side view of the device shown in FIG. 3, further including an oxide layer 30 having metal interconnects 32. Oxide layer 30 can be applied, for example, by chemical vapor deposition, and in one embodiment is 1 micrometer thick. This layer may comprise, for example, SiO$_2$ which is applied using concentrated CVD apparatus and SiH$_4$ and O$_2$ to deposit the oxide. After the oxide layer has been applied, openings are patterned through a mask in a similar manner as described with respect to FIG. 3. Electrical conductors such as metal 32 then fill in the openings to provide contacts and connections for the gate, source, and drain areas. One method for providing these conductors is to sputter a contact metal such as nickel for n+ contacts and titanium/aluminum for p+ contacts and to then sinter them at 950° C. Then layers of titanium, molybdenum, and gold are deposited and etched to form interconnections.

FIG. 7 is a top view of an annular SiC JFET device including a gate G 16 in the shape of an annulus, and drain D and source S areas 18 located inside and outside the annulus, respectively. Although the area inside the gate annulus 16 is labeled as a drain, the drain and source areas 18 are interchangeable. A shallow isolation trench 15 is an optional feature of the device.

FIG. 8 is a sectional side view of one embodiment of the device shown in FIG. 7, wherein gate 16 is fabricated using a separate semiconductor layer in the same manner as discussed with respect to FIG. 3. The only difference is that, instead of a linear pattern, an annular-shaped pattern is used. The gate area of p+ type layer 16 is patterned in an annular shape, and the source and drain areas are implanted such that the drain area is within the gate annulus and the source area is patterned as an annulus surrounding the gate area.

FIG. 9 is a sectional side view of another embodiment of the device shown in FIG. 7, wherein the gate is fabricated using ion implantation. The process of fabricating a gate by ion implantation is similar to the process discussed with respect to FIG. 5, except for the annular patterning.

In another embodiment also represented by FIG. 9, both n type layer 14 and gate 16 are fabricated using ion implantation. The procedures for implanting n type layer 14 in p type layer 12 and for implanting gate 16 in n type layer 14 are similar to the corresponding procedures discussed with respect to FIG. 5, except for the annular patterning.

While only certain preferred features of the invention have been illustrated and described herein, many modifications and changes will occur to those skilled in the art. It is, therefore, to be understood that the appended claims are intended to cover all such modifications and changes as fall within the true spirit of the invention.

What is claimed is:

1. A method for fabricating a silicon carbide (SiC) junction field effect transistor (JFET) device, comprising the steps of:

providing a first SiC semiconductor layer of a first conductivity type;

providing a second SiC semiconductor layer of a second conductivity type supported by said first layer, the contacting surfaces of said first and second layers forming a junction;

providing a gate area of said first conductivity type supported by said second layer by epitaxially depositing, upon said second semiconductor layer, a third SiC semiconductor layer of said first conductivity type and patterning said third layer in the shade of an annulus; and implanting ions of said second conductivity type in said second layer in a source area and a drain area such that one of said source and drain areas is located in the area inside said gate area and the other one of said source and drain areas is located in the shape of an annulus surrounding said gate area.

2. A method for fabricating a silicon carbide (SiC) junction field effect transistor (JFET) device, comprising the steps of:

providing a first SiC semiconductor layer of a first conductivity type;

providing a second SiC semiconductor layer of a second conductivity type supported by said first layer by epitaxially depositing said second layer, the contacting surfaces of said first and second layers forming a junction;

providing a gate area of said first conductivity type supported by said second layer by implanting ions of said first conductivity type in said second layer; and implanting ions of said second conductivity type in said second layer in a source area and a drain area.

3. The method of claim 2, further including the final steps of:
applying an oxide layer over said second layer;
providing openings in said oxide layer aligned with the gate, source, and drain areas; and
providing electrical conductors in said openings.

4. The method of claim 3, wherein the step of applying said oxide layer over said second layer comprises chemical vapor deposition of said oxide layer.

5. The method of claim 2, wherein the step of providing said gate area comprises ion implanting said gate area in the shape of an annulus and wherein said method further comprises ion implanting said source and drain areas such that one of said source and drain areas is located in the area inside said gate area and the other one of said source and drain areas is located in the shape of an annulus surrounding said gate area.

6. The method of claim 2, further including the step of patterning said second layer to form an isolation trench therein after the step of providing said second layer, said trench being positioned to surround said gate, drain, and source areas; and
wherein each one of said source and drain areas is ion implanted on opposite sides, respectively, of said gate area.

7. A method for fabricating a silicon carbide (SiC) junction field effect transistor (JFET) device, comprising the steps of;
providing a first SiC semiconductor layer of a first conductivity type;
providing a second SiC semiconductor layer of a second conductivity type supported by said first layer by implanting ions of said second conductivity type in said first layer, the contacting surfaces of said first and second layers forming a junction;
providing a gate area of said first conductivity type supported by said second layer by implanting ions of said first conductivity type in said second layer; and
implanting ions of said second conductivity type in said second layer in a source area and a drain area.

8. The method of claim 7, wherein said gate area is ion implanted in the shape of an annulus and said source and drain areas are ion implanted such that one of said source and drain areas is located in the area inside said gate area and the other one of said source and drain areas is located in the shape of an annulus surrounding said gate area.

9. The method of claim 7, further including the step of patterning said first and second layers to form an isolation trench therein after the step of providing said second layer, said trench being positioned to surround said gate, source, and drain areas; and
wherein each one of said source and drain areas is ion implanted on opposite sides, respectively, of said gate area.

* * * * *